(12) United States Patent
Liu et al.

(10) Patent No.: US 12,342,519 B2
(45) Date of Patent: Jun. 24, 2025

(54) LIGHTWEIGHT ABSORPTION-TRANSMISSION INTEGRATED METAMATERIAL TO ELECTROMAGNETIC WAVES WITH POLARIZATION STABILITY AND WIDE-INCIDENT-ANGLE STABILITY, AND PREPARATION METHOD THEREOF

(71) Applicants: NORTH UNIVERSITY OF CHINA, Taiyuan (CN); SHANXI ZHONGBEI NEW MATERIAL TECHNOLOGY CO., LTD., Taiyuan (CN)

(72) Inventors: Yaqing Liu, Taiyuan (CN); Guizhe Zhao, Taiyuan (CN); Guanyu Han, Taiyuan (CN)

(73) Assignees: NORTH UNIVERSITY OF CHINA, Taiyuan (CN); SHANXI ZHONGBEI NEW MATERIAL TECHNOLOGY CO., LTD., Taiyuan (CN)

( * ) Notice: Subject to any disclaimer, the term of this patent is extended or adjusted under 35 U.S.C. 154(b) by 0 days.

(21) Appl. No.: 19/009,607

(22) Filed: Jan. 3, 2025

(65) Prior Publication Data
US 2025/0142797 A1   May 1, 2025

Related U.S. Application Data

(63) Continuation of application No. PCT/CN2024/075348, filed on Feb. 1, 2024.

(30) Foreign Application Priority Data

Jan. 30, 2024 (CN) .......................... 202410126663.1

(51) Int. Cl.
*H05K 9/00* (2006.01)
*H01Q 17/00* (2006.01)

(52) U.S. Cl.
CPC ......... *H05K 9/0088* (2013.01); *H01Q 17/008* (2013.01); *H05K 9/0086* (2013.01)

(58) Field of Classification Search
CPC .......................... H05K 9/0088; H01Q 17/008
See application file for complete search history.

(56) References Cited

U.S. PATENT DOCUMENTS

| 5,959,594 A | * | 9/1999 | Wu | H01Q 15/12 343/756 |
| 2014/0266849 A1 | * | 9/2014 | Suorsa | H01Q 17/00 29/601 |

(Continued)

FOREIGN PATENT DOCUMENTS

| CN | 102760965 A | 10/2012 |
| CN | 103296356 A | 9/2013 |

(Continued)

*Primary Examiner* — Hung V Ngo

(57) ABSTRACT

A lightweight absorption-transmission integrated metamaterial to electromagnetic waves with polarization stability and wide-incident-angle stability, which has a symmetric structure including at least one square frequency-selective structure-unit arranged periodically. The square frequency-selective structure-unit includes a first dielectric substrate, a metal array structure layer, a second dielectric substrate, a first carbon-based conductive film array structure layer, a third dielectric substrate, and a second carbon-based conductive film array structure layer, which are laminated in sequence with the first dielectric substrate as the bottom. A method for preparing such lightweight absorption-transmission metamaterial to electromagnetic waves is also provided.

6 Claims, 28 Drawing Sheets

(56) References Cited

U.S. PATENT DOCUMENTS

2017/0200526 A1\* 7/2017 Guo ...................... H10F 71/138
2017/0219746 A1\* 8/2017 Nagao ....................... C23F 1/02

FOREIGN PATENT DOCUMENTS

| CN | 105206942 | A | 12/2015 |
| CN | 105304978 | A | 2/2016 |
| CN | 112290225 | A | 1/2021 |
| CN | 113782975 | A | 12/2021 |
| CN | 114597672 | A | 6/2022 |
| CN | 116315725 | A | 6/2023 |
| JP | 2004356325 | A | 12/2004 |
| KR | 102102745 | B1 | 4/2020 |

\* cited by examiner

LIGHTWEIGHT ABSORPTION-TRANSMISSION INTEGRATED METAMATERIAL TO ELECTROMAGNETIC WAVES WITH POLARIZATION STABILITY AND WIDE-INCIDENT-ANGLE STABILITY, AND PREPARATION METHOD THEREOF

CROSS-REFERENCE TO RELATED APPLICATIONS

This application is a continuation of International Patent Application No. PCT/CN2024/075348, filed on Feb. 1, 2024, which claims the benefit of priority from Chinese Patent Application No. 202410126663.1, filed on Jan. 30, 2024. The content of the aforementioned application, including any intervening amendments thereto, is incorporated herein by reference in its entirety.

TECHNICAL FIELD

This application relates to functional composites, and more particularly to a lightweight absorption-transmission integrated metamaterial to electromagnetic waves with polarization stability and wide-incident-angle stability, and a preparation method thereof.

BACKGROUND

The environmental electromagnetic wave (EMW) radiation will interfere with the normal operation of devices sensitive to EMW, such as civil aircraft radios, radars, and aerospace data transceivers, and also potentially threaten human health. Therefore, the research and development of EMW absorbing (EMWA) materials have attracted considerable attention. Carbon-based films possess advantages such as low density, good environmental stability, adjustable electron mobility, and designable structural configuration, and thus have been widely considered as a promising EMWA material.

As a novel material with extraordinary physical properties, metamaterials are composed of artificial functional units arranged in a specific manner. Compared to conventional materials, metamaterials can be precisely regulated in terms of the response frequency band and performance strength, and also have advantages such as light weight and small thickness. As one of the application branches of metamaterials, metamaterial absorbers are specialized materials capable of absorbing or scattering EMWs, or altering the propagation direction of EMWs.

As a novel EMWA material, frequency selective surface (FSS) belongs to metamaterials, which has a periodic structure formed by units such as patches or apertures. Through the structural regulation of these patches and apertures, FSS can achieve transparent transmission or strong reflection within the target electromagnetic wave frequency band. The novel FSS made of carbon-based conductive composites is characterized by light weight, and excellent corrosion resistance and high-temperature resistance. In particular, the absorption bandwidth can be effectively broadened, which makes this FSS become a research hotspot.

However, the existing band-pass type FSSs generally struggle with high insertion loss when exposed to wide-angle incident EMWs. Moreover, the appearance of grating lobes will make the out-of-band suppression performance deteriorate. Additionally, the absorption bandwidth of the current metamaterial absorbers is unstable, and EMW reflection may still occur within the band. Furthermore, their polarization stability and wide-angle oblique incidence stability are not ideal.

SUMMARY

An object of the disclosure is to provide a lightweight absorption-transmission integrated metamaterial to EMWs with polarization stability and wide-incident-angle stability, and a preparation method thereof for solving the problems in the prior art that the existing metamaterial absorbers have high specific gravity, complex manufacturing process, large pass-band insertion loss, and poor wide-angle EMWA performance.

Technical solutions of the present disclosure are described as follows.

In a first aspect, this application provides a lightweight absorption-transmission integrated metamaterial to EMWs with polarization stability and wide-incident-angle stability, wherein the lightweight absorption-transmission integrated metamaterial is a symmetrical structure comprising at least one square frequency-selective structure-unit arranged periodically;

a side length of each of the at least one square frequency-selective structure-unit is 50 mm; each of the at least one square frequency-selective structure-unit comprises a first dielectric substrate, a metal array structure layer, a second dielectric substrate, a first carbon-based conductive film array structure layer, a third dielectric substrate, and a second carbon-based conductive film array structure layer laminated in sequence, the first dielectric substrate serves as a bottom layer, and the second carbon-based conductive film array structure layer serves as a top layer;

the metal array structure layer is configured as a frequency-selective-transmission layer, and is made of a metal patch;

the first carbon-based conductive film array structure layer and the second carbon-based conductive film array structure layer are each configured as a frequency-selective-absorption layer, and are both made of a carbon-based conductive film patch;

the metal array structure layer is provided with a basic-structure-unit composed of four square ring apertures arranged periodically;

the first carbon-based conductive film array structure layer comprises a basic-structure-unit composed of a cross-shaped structure patch; and the second carbon-based conductive film array structure layer comprises a basic-structure-unit composed of four square ring patches arranged periodically.

In some embodiments, a center point of each of the basic-structure-unit cross-shaped structure patch of the first carbon-based conductive film array structure layer is configured as a symmetry center of each of the at least one square frequency-selective structure-unit; the basic-structure-unit of the metal array structure layer is arranged centro-symmetrically, and its basic-structure-unit composed of the four square ring apertures is located in the four regions defined by the basic-structure-unit composed of the cross-shaped structure patch of the first carbon-based conductive film array structure layer, respectively; and the basic-structure-unit of the second carbon-based conductive film array structure layer is arranged centro-symmetrically, and its basic-structure-unit composed of the four square ring patches are located in the four regions defined by the basic-structure-unit composed of the cross-shaped structure patch of the first carbon-based conductive film array structure layer.

In some embodiments, the basic-structure-unit composed of the four square ring apertures of the metal array structure layer is made of a copper patch with an electrical conductivity of $5.8 \times 10^7$ S/m;

a sheet resistance of the carbon-based conductive film patch of the first carbon-based conductive film array structure layer is 50-110 Ω/sq; and a sheet resistance of the carbon-based conductive film patch of the second carbon-based conductive film array structure layer is 90-130 Ω/sq.

In some embodiments, the first dielectric substrate, the second dielectric substrate, and the third dielectric substrate are each made of an epoxy resin-reinforced glass fiber composite board with a permittivity of 4.3.

In some embodiments, a thickness $H_1$ of the first dielectric substrate is 0.5-0.7 mm; a thickness $H_2$ of the second dielectric substrate is 1.5-1.8 mm; and a thickness $H_3$ of the third dielectric substrate is 0.9-1.3 mm.

In some embodiments, in the basic-structure-unit of the metal array structure layer, each of the four square ring apertures has an outer-ring side length L of 19-21 mm and an inner-ring side length $L_1$ of 16-18 mm;

in the basic-structure-unit of the first carbon-based conductive film array structure layer, four sides of the cross-shaped structure patch each has a length $L_2$ of 14-18 mm and a width $L_3$ of 2-4 mm; and in the basic-structure-unit of the second carbon-based conductive film array structure layer, each of the four square ring patches has an inner-ring side length $L_4$ of 7-10 mm and an outer-ring side length $L_5$ of 15-18 mm.

In a second aspect, this application provides a method for preparing the lightweight absorption-transmission integrated metamaterial, comprising:

(1) designing an absorption-transmission integrated metamaterial composed of square frequency-selective structure-units arranged in an array of N×M, wherein the N and M are each independently a positive integer; and producing the first dielectric substrate, the second dielectric substrate, and the third dielectric substrate by cutting according to the design;

(2) producing N×M basic-structure-units of the first carbon-based conductive film array structure layer according to the design by cutting, and producing N×M basic-structure-unit of the second carbon-based conductive film array structure layer according to the design by cutting;

(3) engraving N×M basic-structure-units of the metal array structure layer on a metal patch using an engraving machine based on the design; and (4) marking first areas on the first dielectric substrate respectively corresponding to the N×M basic-structure-units of the metal array structure layer, and attaching the engraved N×M basic-structure-units of the metal array structure layer respectively to the first areas on the first dielectric substrate;

marking second areas on the second dielectric substrate respectively corresponding to the N×M basic-structure-units of the first carbon-based conductive film array structure layer, and attaching the N×M basic-structure-units of the first carbon-based conductive film array structure layer respectively to the second areas on the second dielectric substrate;

marking third areas on the third dielectric substrate respectively corresponding to the N×M basic-structure-units of the second carbon-based conductive film array structure layer, and attaching the N×M basic-structure-units of the second carbon-based conductive film array structure layer respectively to the third areas on the third dielectric substrate; and stacking the first dielectric substrate with the metal array structure layer, the second dielectric substrate with the first carbon-based conductive film array structure layer, and the third dielectric substrate with the second carbon-based conductive film array structure layer sequentially to obtain the lightweight absorption-transmission integrated metamaterial.

Compared to the prior art, the present disclosure has the following beneficial effects.

(1) Through the coupling of multi-layer periodic unit arrays, the present disclosure achieves the cost-effective and simple preparation of a lightweight absorption-transmission integrated metamaterial with excellent polarization stability, superior wide-incident-angle stability, low insertion loss in the transmission frequency band, high absorption rate in the absorption frequency band, and readily-tunable frequency band.

(2) By replacing the metal patterned metastructures commonly employed in the prior art with a carbon-based conductive film-based loss layer, the metamaterial provided herein exhibits several advantages, including light weight, excellent corrosion resistance and high-temperature resistance, and low insertion loss.

BRIEF DESCRIPTION OF THE DRAWINGS

The accompanying drawings are provided to facilitate the understanding of the technical solutions of the present disclosure, and form a part of the specification to illustrate the disclosure together with the embodiments. The accompanying drawings are illustrative and exemplary, and are not intended to limit the disclosure.

In order to illustrate the technical solutions in the embodiments of the present disclosure or the prior art more clearly, the needed accompanying drawings will be briefly described below. Obviously, presented in the accompanying drawings are only some embodiments of the present disclosure, and for those of ordinary skill in the art, other accompanying drawings can be obtained from the structures illustrated therein without making creative effort.

DETAILED DESCRIPTION OF EMBODIMENTS

To facilitate the understanding of the objectives, features, and advantages of the present disclosure, the disclosure will be described in detail below with reference to embodiments and accompanying drawings. It should be noted that the embodiments of the present disclosure and the features therein may be combined in the absence of contradiction.

Many specific details are provided below to facilitate a comprehensive understanding of the present disclosure. However, it should be noted that the disclosure may be implemented in ways other than those explicitly described herein. It is obvious that described herein are merely some embodiments of the present disclosure, instead of all embodiments.

Figure 1:
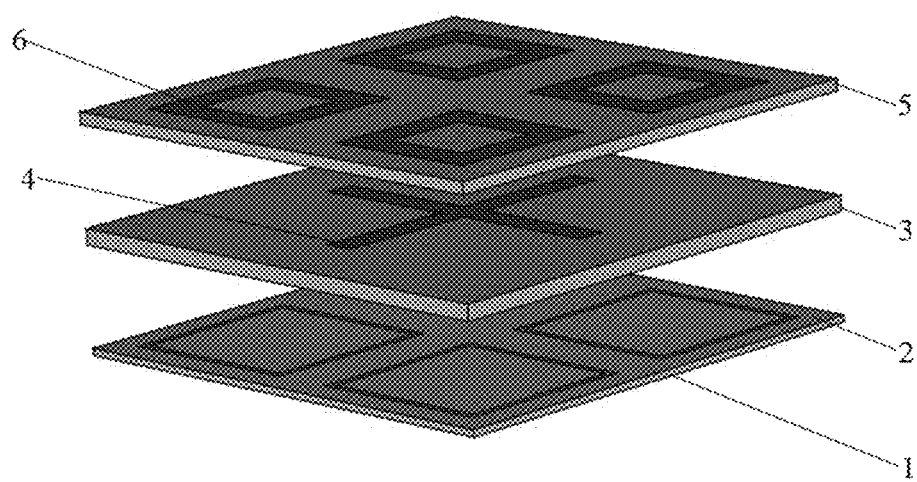
FIG. 1 schematically shows a square frequency-selective structure-unit of a lightweight absorption-transmission integrated metamaterial to EMWs with polarization stability and wide-incident-angle stability in accordance with an embodiment of the present disclosure.
Figure 2:
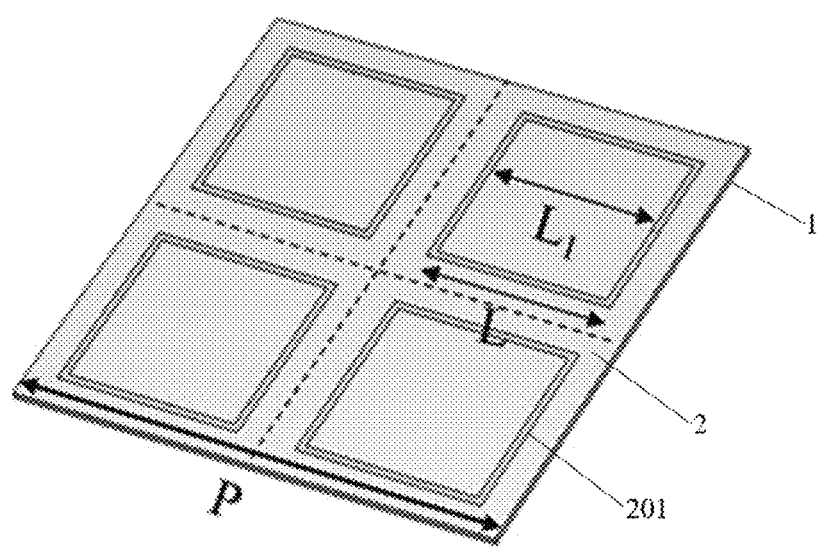
FIG. 2 schematically shows a basic-structure-unit of a metal array structure layer of the square frequency-selective structure-unit and its arrangement on a first dielectric substrate in accordance with an embodiment of the present disclosure.
Figure 3:
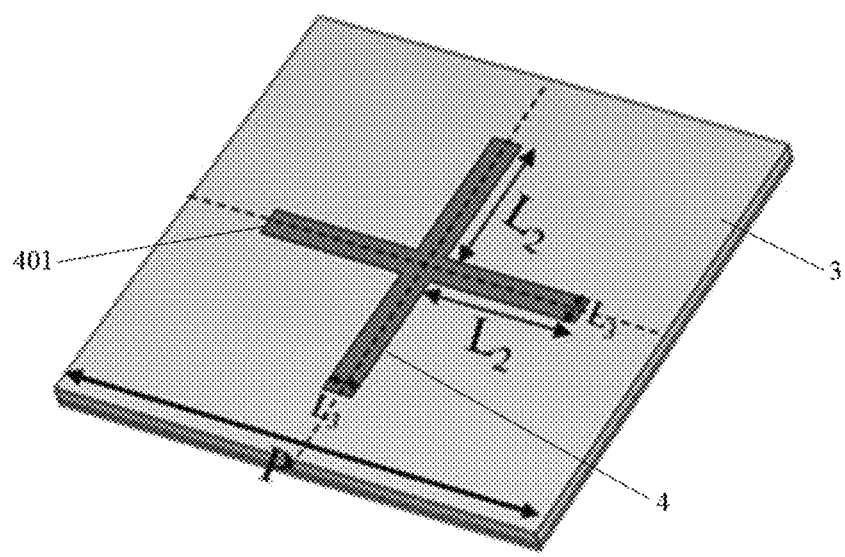
FIG. 3 schematically shows a basic-structure-unit of a first carbon-based conductive film array structure layer of the square frequency-selective structure-unit and its arrangement on a second dielectric substrate in accordance with an embodiment of the present disclosure.
Figure 4:
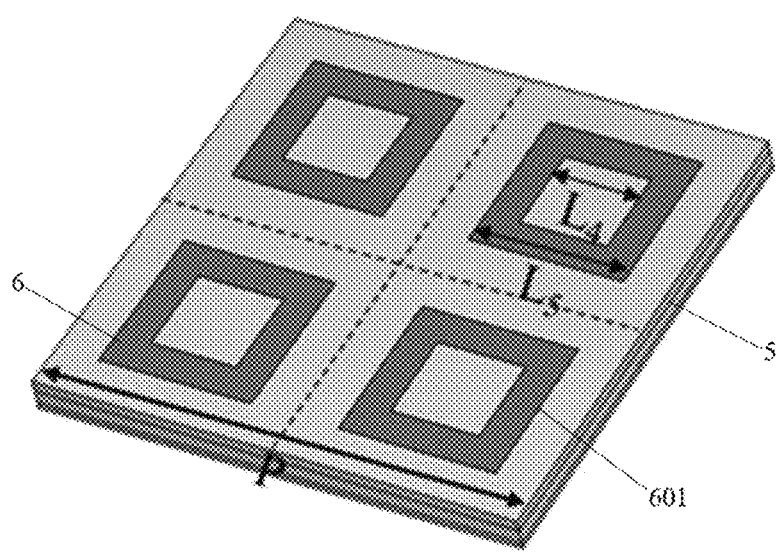
FIG. 4 schematically shows a basic-structure-unit of a second carbon-based conductive film array structure layer of the square frequency-selective structure-unit and its arrangement on a third dielectric substrate in accordance with an embodiment of the present disclosure.

The present disclosure provides a lightweight absorption-transmission integrated metamaterial to EMWs with polarization stability and wide-incident-angle stability, which has a symmetric structure including at least one square frequency-selective structure-unit arranged periodically. A side length (P) of the square frequency-selective structure-unit is 50 mm. The square frequency-selective structure-unit includes a first dielectric substrate 1, a metal array structure layer 2, a second dielectric substrate 3, a first carbon-based conductive film array structure layer 4, a third dielectric substrate 5, and a second carbon-based conductive film array structure layer 6 laminated in sequence, the first dielectric substrate 1 serves as a bottom layer, and the second carbon-based conductive film array structure layer 6 serves as a top layer. The metal array structure layer 2 is configured as a frequency-selective-transmission layer, and is made of a metal patch. The first carbon-based conductive film array structure layer 4 and the second carbon-based conductive film array structure layer 6 are each configured as a frequency-selective-absorption layer, and are both made of a carbon-based conductive film patch. The metal array structure layer 2 is provided with a basic-structure-unit composed of four square ring apertures 201 arranged periodically. The first carbon-based conductive film array structure layer 4 includes a basic-structure-unit composed of a cross-shaped structure patch 401. The second carbon-based conductive film array structure layer 6 includes a basic-structure-unit composed of four square ring patches 601 arranged periodically. As shown in FIG. 1, a center point of each of the basic-structure-unit composed of the cross-shaped structure patch 401 of the first carbon-based conductive film array structure layer 4 is configured as a horizontal symmetry center of each of the at least one square frequency-selective structure-unit. The basic-structure-unit of the metal array structure layer 2 is arranged centro-symmetrically, and its basic-structure-unit composed of the four square ring apertures is located in the four regions defined by the basic-structure-unit composed of the cross-shaped structure patch 401 of the first carbon-based conductive film array structure layer 4, respectively. The basic-structure-unit of the second carbon-based conductive film array structure layer 6 is arranged centro-symmetrically, and its basic-structure-unit composed of the four square ring patches is located in the four regions defined by the basic-structure-unit composed of the cross-shaped structure patch of the first carbon-based conductive film array structure layer 4. As shown in FIG. 2, in the basic-structure-unit of the metal array structure layer 2, an inner-ring side and an outer-ring side of each square ring aperture 201 are parallel to the corresponding sides of the first dielectric substrate 1, respectively. As shown in FIG. 3, in the basic-structure-unit of the first carbon-based conductive film array structure layer 4, four sides of the cross-shaped structure patch 401 are parallel to the corresponding sides of the second dielectric substrate 3, respectively. As shown in FIG. 4, in the basic-structure-unit of the second carbon-based conductive film array structure layer 6, an inner-ring side and an outer-ring side of each square ring patch 601 are parallel to the corresponding sides of the third dielectric substrate 5, respectively.

In an embodiment, the basic-structure-unit composed of the four square ring apertures of the metal array structure layer 2 is made of a copper patch with an electrical conductivity of $5.8 \times 10^7$ S/m. A sheet resistance of the carbon-based conductive film patch of the first carbon-based conductive film array structure layer 4 is 50-110 ω/sq. A sheet resistance of the carbon-based conductive film patch of the second carbon-based conductive film array structure layer 6 is 90-130 ω/sq.

In an embodiment, the first dielectric substrate 1, the second dielectric substrate 3, and the third dielectric substrate 5 are each made of an epoxy resin-reinforced glass fiber composite board with a permittivity of 4.3.

In an embodiment, in the square frequency-selective structure-unit, a thickness $H_1$ of the first dielectric substrate 1 is 0.5-0.7 mm. A thickness $H_2$ of the second dielectric substrate 3 is 1.5-1.8 mm. A thickness $H_3$ of the third dielectric substrate 5 is 0.9-1.3 mm.

In an embodiment, in the basic-structure-unit of the metal array structure layer, each of the four square ring apertures 201 has an outer-ring side length L of 19-21 mm and an inner-ring side length $L_1$ of 16-18 mm. In the basic-structure-unit of the first carbon-based conductive film array structure layer 4, the four sides of the cross-shaped structure patch 401 has a length $L_2$ of 14-18 mm and a width $L_3$ of 2-4 mm. In the basic-structure-unit of the second carbon-based conductive film array structure layer 6, each of the four square ring patches 601 has an inner-ring side length $L_4$ of 7-10 mm and an outer-ring side length $L_5$ of 15-18 mm.

The present disclosure further provides a method for preparing the lightweight absorption-transmission integrated metamaterial, which is performed as follows.

(1) A lightweight absorption-transmission integrated metamaterial composed of square frequency-selective structure-units arranged in an array of N×M is designed, where the N and M are each independently a positive integer. The first dielectric substrate 1, the second dielectric substrate 3, and the third dielectric substrate 5 are produced by cutting according to the design.

(2) N×M basic-structure-units of the first carbon-based conductive film array structure layer 4 are produced by cutting according to the design, and N×M basic-structure-units of the second carbon-based conductive film array structure layer 6 are produced by cutting according to the design.

(3) N×M basic-structure-units of the metal array structure layer 2 are engraved on a metal patch using an engraving machine based on the design.

(4) First areas respectively corresponding to the N×M basic-structure-units of the metal array structure layer 2 are marked on the first dielectric substrate 1, and the engraved N×M basic-structure-units of the metal array structure layer 2 respectively are attached to the first areas on the first dielectric substrate 1.

Second areas respectively corresponding to the N×M basic-structure-units of the first carbon-based conductive film array structure layer are marked on the second dielectric substrate, and the N×M basic-structure-units of the first carbon-based conductive film array structure layer 4 are respectively attached to the second areas on the second dielectric substrate 3.

Third areas respectively corresponding to the N×M basic-structure-units of the second carbon-based conductive film array structure layer 6 are marked on the third dielectric substrate, and the N×M basic-structure-units of the second carbon-based conductive film array structure layer 6 are respectively attached to the third areas on the third dielectric substrate.

The first dielectric substrate 1 with the metal array structure layer 2, the second dielectric substrate 3 with the first carbon-based conductive film array structure layer 4, and the third dielectric substrate 5 with the second carbon-based conductive film array structure layer 6 are stacked sequentially to obtain the lightweight absorption-transmission integrated metamaterial.

A detailed description of specific embodiments of the present disclosure is provided below. The epoxy resin-reinforced glass fiber composite board adopted in the following embodiments is a flame retardant-4 (FR-4) board purchased from Shenzhen Xiongyihua Plastic Insulation Co., Ltd, and the carbon-based conductive thin-film is purchased from Dongguan Hengsheng Co., Ltd.

Example 1

Provided herein is a lightweight absorption-transmission integrated metamaterial to EMWs with polarization stability and wide-incident-angle stability, which has a symmetric structure including 4×4 (i.e., N=4, M=4) square frequency-selective structure-units arranged periodically, that is, 16 periodically-arranged square frequency-selective structure-units shown in FIG. 1.

A side length (P) of the square frequency-selective structure-unit is 50 mm. The square frequency-selective structure-unit includes a first dielectric substrate 1, a metal array structure layer 2, a second dielectric substrate 3, a first carbon-based conductive film array structure layer 4, a third dielectric substrate 5, and a second carbon-based conductive film array structure layer 6 laminated in sequence, the first dielectric substrate 1 serves as a bottom layer, and the second carbon-based conductive film array structure layer 6 serves as a top layer (with the top being a direction of electromagnetic wave incidence).

The first dielectric substrate 1 is an FR-4 board with a size of 200 mm×200 mm×0.7 mm (thickness $H_1$), and a permittivity of 4.3.

The second dielectric substrate 3 is an FR-4 board with a size of 200 mm×200 mm×1.6 mm (thickness $H_2$), and a permittivity is 4.3.

The third dielectric substrate 5 is an FR-4 board with a size of 200 mm×200 mm×1.2 mm (thickness $H_3$), and a permittivity of 4.3.

The metal array structure layer 2 includes 16 basic-structure-units (i.e., N=4, M=4) shown in FIG. 2, and each basic-structure-unit is composed of four square ring apertures 201 arranged periodically. Each square ring aperture has an outer-ring side length L of 19 mm and an inner-ring side length $L_1$ of 17.5 mm. The metal array structure layer 2 is made of a copper patch with an electrical conductivity of $5.8 \times 10^7$ S/m.

The first carbon-based conductive film array structure layer 4 includes 16 basic-structure-units shown in FIG. 3, and each basic-structure-unit is composed of a cross-shaped structure patch 401. Four sides of the cross-shaped structure patch each has a length $L_2$ of 15 mm and a width $L_3$ of 3 mm. The carbon-based conductive film patch is made from carbon black and carbon nanotubes, with a sheet resistance of 80 Ω/sq.

The second carbon-based conductive film array structure layer 6 includes 16 basic-structure-units shown in FIG. 4, and each basic-structure-unit is composed of four square ring patches 601 arranged periodically. Each square ring patch has an inner-ring side length $L_4$ of 9 mm and an outer-ring side length $L_5$ of 16 mm. The carbon-based conductive film patch is made from carbon black and carbon nanotubes, with a sheet resistance of 100 Ω/sq.

The center point of each of the basic-structure-unit composed of the cross-shaped structure patch 401 of the first carbon-based conductive film array structure layer 4 is configured as the horizontal symmetry center of each of the at least one square frequency-selective structure-unit. The basic-structure-unit of the metal array structure layer 2 is arranged centro-symmetrically, and its basic-structure-unit composed of the four square ring apertures is located in the four regions defined by the basic-structure-unit composed of the cross-shaped structure patch 401 of the first carbon-based conductive film array structure layer 4, respectively. The basic-structure-unit of the second carbon-based conductive film array structure layer 6 is arranged centro-symmetrically, and its basic-structure-unit composed of the four square ring patches is located in the four regions defined by the basic-structure-unit composed of the cross-shaped structure patch of the first carbon-based conductive film array structure layer 4.

The lightweight absorption-transmission integrated metamaterial is prepared through the following steps.
(1) The lightweight absorption-transmission integrated metamaterial is designed to arrange square frequency-selective structure-units in a 4×4 array (i.e., N=M=4). A purchased FR-4 board is cut into the first dielectric substrate 1 with a size of 200 mm×200 mm×0.7 mm, the second dielectric substrate 3 with a size of 200 mm×200 mm×1.6 mm, and the third dielectric substrate 5 with a size of 200 mm×200 mm×1.2 mm by using a cutting machine.

(2) The basic-structure-units of the first carbon-based conductive film array structure layer 4 and the second carbon-based conductive film array structure layer 6 are drawn on the computer according to the design, and printed to obtain their respective templates. Then, based on the templates, the purchased carbon-based conductive film product is cut into 16 basic-structure-units of the first carbon-based conductive film array structure layer 4 and 16 basic-structure-units of the second carbon-based conductive film array structure layer 6.

(3) The copper sheet is engraved using an engraving machine to form 16 basic-structure-units of the metal array structure layer 2.

(4) First areas respectively corresponding to the basic-structure-units of the metal array structure layer 2 are marked on the first dielectric substrate 1, and the basic-structure-units of the metal array structure layer 2 are respectively attached to the first areas by using a commercially available high-transparency double-sided adhesive tape.

Second areas respectively corresponding to the basic-structure-units of the first carbon-based conductive film array structure layer 4 are marked on the second dielectric substrate 3, and the basic-structure-units of the first carbon-based conductive film array structure layer 4 are respectively attached to the second areas by using the commercially available high-transparency double-sided adhesive tape.

Third areas respectively corresponding to the basic-structure-units of the second carbon-based conductive film array structure layer 6 are marked on the third dielectric substrate 5, and the basic-structure-units of the second carbon-based conductive film array structure layer 6 are respectively attached to the third areas by using the commercially available high-transparency double-sided adhesive tape.

Then the first dielectric substrate 1 with the metal array structure layer 2, the second dielectric substrate 3 with the first carbon-based conductive film array structure layer 4, and the third dielectric substrate 5 with the second carbon-based conductive film array structure layer 6 are sequentially laminated and bonded with the commercially available high-transparency double-sided adhesive tape, so as to arrive at the desired lightweight absorption-transmission integrated metamaterial with polarization stability and wide-incident-angle stability.

Figure 5A:
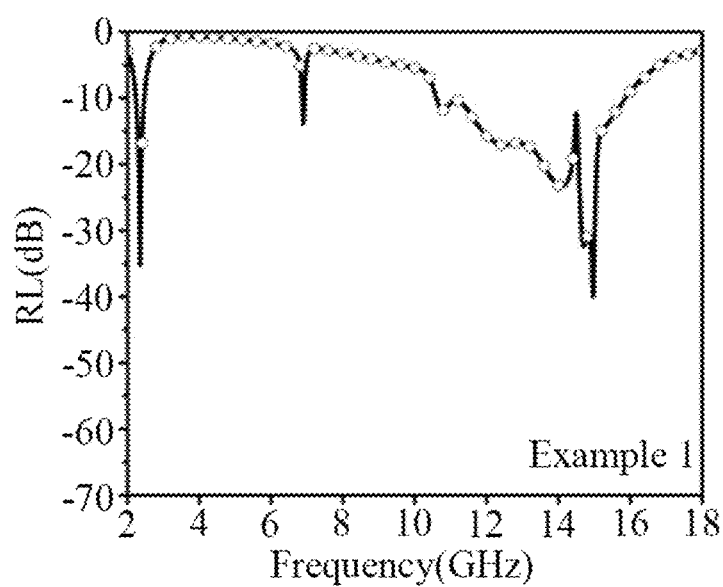
FIGS. 5A-5D are the EMW reflection loss (RL) curves of the absorption-transmission integrated metamaterials respectively prepared in Examples 1-4 of the present disclosure within an EMW frequency range of 2-18 GHz.

As shown in FIG. 5A, a minimum reflection loss (RL) of the lightweight absorption-transmission integrated metamaterial provided herein appears at 14.96 GHz, where a strong absorption of −39.98 dB is generated. Moreover, an effective absorption bandwidth (RL≤−10 dB) reaches 5.5 GHZ (10.5-16 GHZ).

Figure 6A:
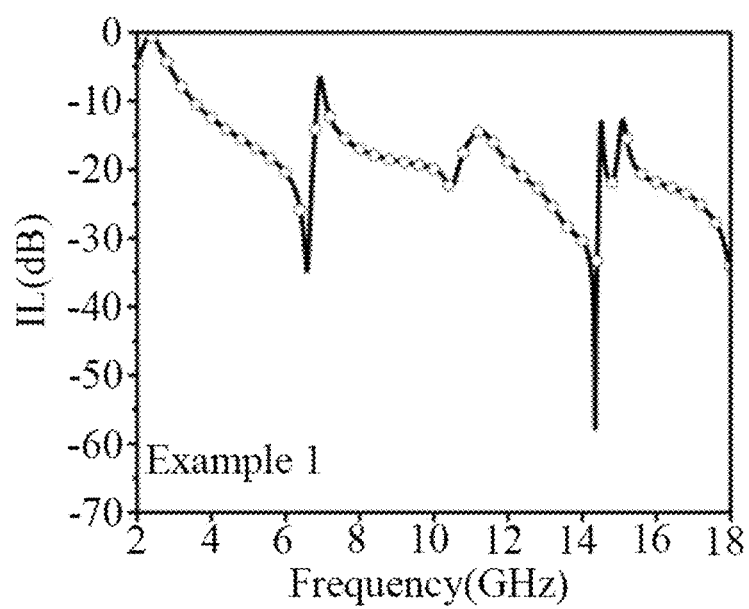
FIGS. 6A-6D are the EMW insertion loss (IL) curves of the lightweight absorption-transmission integrated metamaterials respectively prepared in Examples 1-4 of the present disclosure within the EMW frequency range of 2-18 GHz.

As shown in FIG. 6A, a minimum insertion loss (IL) of the lightweight absorption-transmission integrated metamaterial provided herein is 0.66 dB, which appears at 2.37 GHz, and the corresponding transmissivity can reach 85% or more. Moreover, the IL is equal to or less than −3 dB over a frequency range of 2.09-2.69 GHz.

As shown in FIGS. 7A-7D, under a transverse electric (TE) polarization mode, when the incident angle increases from 0° to 45°, the metamaterial obtained herein exhibits a stable strong wave-absorbing performance within an absorption frequency band (with an absorption rate greater than 90%). As shown in FIGS. 8A-8D, under a transverse magnetic (TM) polarization mode, when the incident angle increases from 0° to 45°, the overall wave-absorbing performance of the metamaterial provided herein remains stable in the absorption frequency band, exhibiting a good wide-incident-angle stability. The results revealed by FIGS. 7A-7D and 8A-8D demonstrate that the metamaterial absorber provided herein has excellent polarization stability and wide-incident-angle stability, which can be attributed to the strong symmetry and miniaturized design of the structure units and the basic-structure-units. Under the TE and TM polarization modes, the oblique incidence responses both reach 45°.

As shown in FIGS. 9A-9D, under the TE polarization mode, when the incident angle of the electromagnetic wave increases from 0° to 45°, the transmissivity of a wave-transmitting window of the metamaterial provided herein remains above 85%. As shown in FIGS. 10A-10D, under the TM polarization mode, when the incident angle increases from 0° to 45°, the transmissivity of the wave-transmitting window of the metamaterial disclosed herein remains nearly constant, exhibiting a good wide-incident-angle stability. The results revealed by FIGS. 9A-9D and 10A-10D demonstrate that the metamaterial absorber provided herein has excellent polarization stability and wide-incident-angle stability, which can be attributed to the strong symmetry and miniaturized design of the structure units and the basic-structure-units. Under the TE and TM polarization modes, the oblique incidence responses both reach 45°.

Example 2

Provided herein is a lightweight absorption-transmission integrated metamaterial to EMWs with polarization stability and wide-incident-angle stability, which has a symmetric structure including 2×2 (i.e., N=2, M=2) square frequency-selective structure-units arranged periodically, that is, 4 periodically-arranged square frequency-selective structure-units shown in FIG. 1.

A side length (P) of the square frequency-selective structure-unit is 50 mm. The square frequency-selective structure-unit includes a first dielectric substrate 1, a metal array structure layer 2, a second dielectric substrate 3, a first carbon-based conductive film array structure layer 4, a third dielectric substrate 5, and a second carbon-based conductive film array structure layer 6 laminated in sequence, the first dielectric substrate 1 serves as a bottom layer, and the second carbon-based conductive film array structure layer 6 serves as a top layer (with the top being a direction of electromagnetic wave incidence).

The first dielectric substrate 1 is an FR-4 board with a size of 100 mm×100 mm×0.5 mm (thickness $H_1$), and a permittivity of 4.3.

The second dielectric substrate 3 is the FR-4 board with a size of 100 mm×100 mm×1.8 mm (thickness $H_2$), and a permittivity of 4.3.

The third dielectric substrate 5 is the FR-4 board with a size of 100 mm×100 mm×0.9 mm (thickness $H_3$), and a permittivity of 4.3.

The metal array structure layer 2 includes 4 basic-structure-units (i.e., N=2, M=2) shown in FIG. 2, and each basic-structure-unit is composed of four square ring apertures 201 arranged periodically. Each square ring aperture has an outer-ring side length L of 19 mm and an inner-ring side length $L_1$ of 18 mm. The metal array structure layer 2 is made of a copper patch with an electrical conductivity of $5.8×10^7$ S/m.

The first carbon-based conductive film array structure layer 4 includes 4 basic-structure-units shown in FIG. 3, and each basic-structure-unit is composed of a cross-shaped structure patch 401. Four sides of the cross-shaped structure patch each has a length $L_2$ of 14 mm and a width $L_3$ of 3 mm.

The carbon-based conductive film patch is made from carbon black and carbon nanotubes, with a sheet resistance of 110 Ω/sq.

The second carbon-based conductive film array structure layer 6 includes 4 basic-structure-units shown in FIG. 4, and each basic-structure-unit is composed of four square ring patches 601 arranged periodically. Each square ring patch has an inner-ring side length $L_4$ of 10 mm and an outer-ring side length $L_5$ of 15 mm. The carbon-based conductive film patch is made from carbon black and carbon nanotubes, with a sheet resistance of 100 Ω/sq.

The center point of each of the basic-structure-unit composed of the cross-shaped structure patch 401 of the first carbon-based conductive film array structure layer 4 is configured as the horizontal symmetry center of each of the at least one square frequency-selective structure-unit. The basic-structure-unit of the metal array structure layer 2 is arranged centro-symmetrically, and its basic-structure-unit composed of the four square ring apertures is located in the four regions defined by the basic-structure-unit composed of the cross-shaped structure patch 401 of the first carbon-based conductive film array structure layer 4, respectively. The basic-structure-unit of the second carbon-based conductive film array structure layer 6 is arranged centro-symmetrically, and its basic-structure-unit composed of the four square ring patches is located in the four regions defined by the basic-structure-unit composed of the cross-shaped structure patch of the first carbon-based conductive film array structure layer 4.

The method of preparing the lightweight absorption-transmission integrated metamaterial with polarization stability and wide-incident-angle stability provided herein is different from that provided in Example 1 merely in the differences in materials and structural parameters.

Figure 5B:
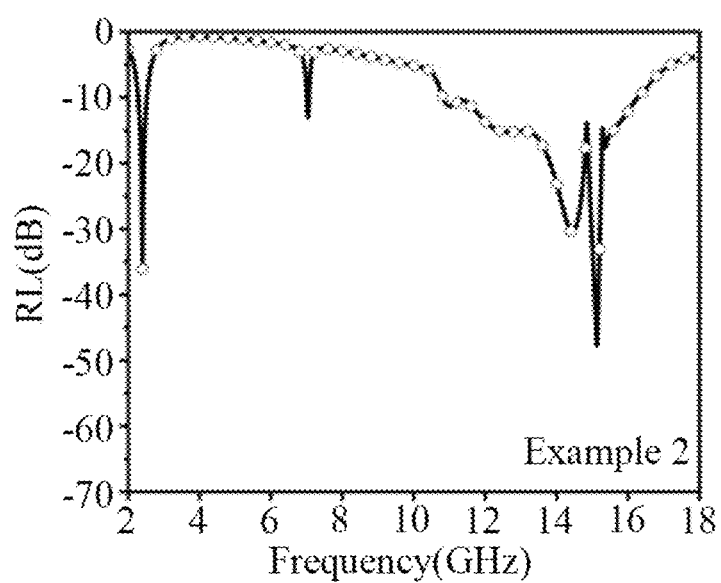

As shown in FIG. 5B, a minimum RL of the lightweight absorption-transmission integrated metamaterial provided herein appears at 15.12 GHz, where a strong absorption of −47.7 dB is generated. Moreover, an effective absorption bandwidth (RL≤−10 dB) reaches 5.5 GHZ (10.7-16.2 GHz).

Figure 6B:
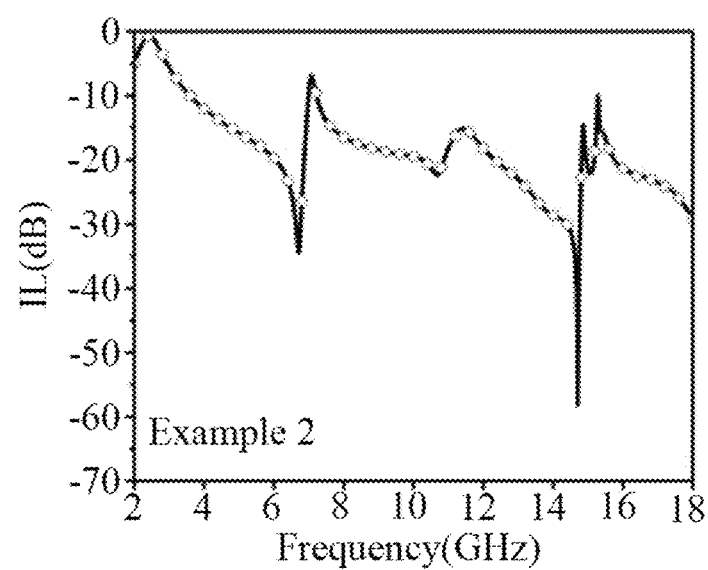

As shown in FIG. 6B, a minimum IL of the lightweight absorption-transmission integrated metamaterial provided herein is 0.67 dB, which appears at 2.42 GHz, and the corresponding transmissivity can reach 85% or more. Moreover, the IL is equal to or less than −3 dB over a frequency range of 2.12-2.75 GHz.

Example 3

Provided herein is a lightweight absorption-transmission integrated metamaterial to EMWs with polarization stability and wide-incident-angle stability, which has a symmetric structure including 5×5 (i.e., N=5, M=5) square frequency-selective structure-units arranged periodically, that is, 25 periodically-arranged square frequency-selective structure-units shown in FIG. 1.

A side length (P) of the square frequency-selective structure-unit is 50 mm. The square frequency-selective structure-unit includes a first dielectric substrate 1, a metal array structure layer 2, a second dielectric substrate 3, a first carbon-based conductive film array structure layer 4, a third dielectric substrate 5, and a second carbon-based conductive film array structure layer 6 laminated in sequence, the first dielectric substrate 1 serves as a bottom layer, and the second carbon-based conductive film array structure layer 6 serves as a top layer (with the top being a direction of electromagnetic wave incidence).

The first dielectric substrate 1 is an FR-4 board with a size of 250 mm×250 mm×0.6 mm (thickness $H_1$), and a permittivity of 4.3.

The second dielectric substrate 3 is an FR-4 board with a size of 250 mm×250 mm×1.5 mm (thickness $H_2$), and a permittivity of 4.3.

The third dielectric substrate 5 is an FR-4 board with a size of 250 mm×250 mm×1.3 mm (thickness $H_3$), and a permittivity of 4.3.

The metal array structure layer 2 includes 25 basic-structure-units (i.e., N=5, M=5) shown in FIG. 2, each basic-structure-unit is composed of four square ring apertures 201 arranged periodically. Each square ring aperture has an outer-ring side length L of 21 mm and an inner-ring side length $L_1$ of 17.5 mm. The metal array structure layer 2 is made of a copper patch with an electrical conductivity of $5.8 \times 10^7$ S/m.

The first carbon-based conductive film array structure layer 4 includes 25 basic-structure-units shown in FIG. 3, and each basic-structure-unit is composed of a cross-shaped structure patch 401. Four sides of the cross-shaped structure patch each has a length $L_2$ of 16 mm and a width $L_3$ of 2 mm. The carbon-based conductive film patch is made from carbon black and carbon nanotubes, with a sheet resistance of 50 Ω/sq.

The second carbon-based conductive film array structure layer 6 includes 25 basic-structure-units shown in FIG. 4, and each basic-structure-unit is composed of four square ring patches 601 arranged periodically. Each square ring patch has an inner-ring side length $L_4$ of 7 mm and an outer-ring side length $L_5$ of 15 mm. The carbon-based conductive film patch is made from carbon black and carbon nanotubes, with a sheet resistance of 130 Ω/sq.

The center point of each of the basic-structure-unit composed of the cross-shaped structure patch 401 of the first carbon-based conductive film array structure layer 4 is configured as the horizontal symmetry center of each of the at least one square frequency-selective structure-unit. The basic-structure-unit of the metal array structure layer 2 is arranged centro-symmetrically, and its basic-structure-unit composed of the four square ring apertures is located in the four regions defined by the basic-structure-unit composed of the cross-shaped structure patch 401 of the first carbon-based conductive film array structure layer 4, respectively. The basic-structure-unit of the second carbon-based conductive film array structure layer 6 is arranged centro-symmetrically, and its basic-structure-unit composed of the four square ring patches is located in the four regions defined by the basic-structure-unit composed of the cross-shaped structure patch of the first carbon-based conductive film array structure layer 4.

The method of preparing the lightweight absorption-transmission integrated metamaterial with polarization stability and wide-incident-angle stability provided herein is different from that provided in Example 1 merely in the differences in materials and structural parameters.

Figure 5C:
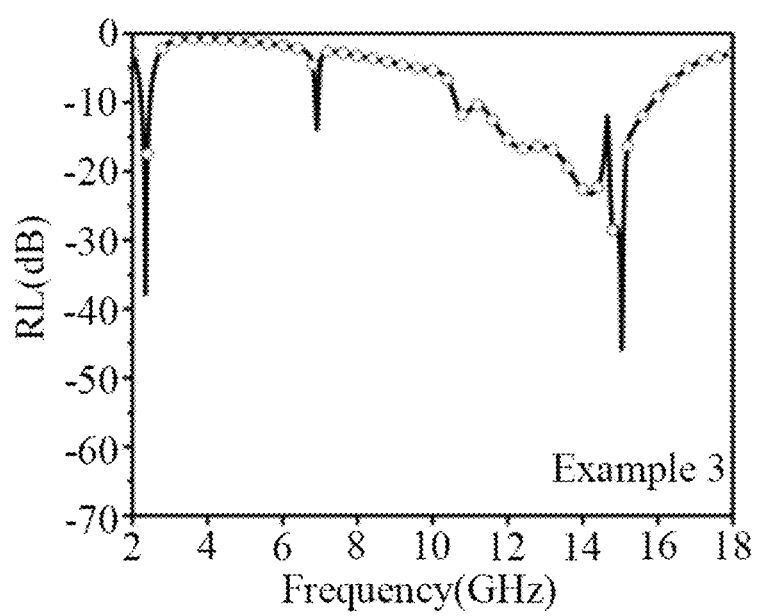

As shown in FIG. 5C, a minimum RL of the lightweight absorption-transmission integrated metamaterial provided herein appears at 15.04 GHz, where a strong absorption of −45.76 dB is generated. Moreover, an effective absorption bandwidth (RL≤−10 dB) reaches 5.3 GHZ (10.6-15.9 GHZ).

Figure 6C:
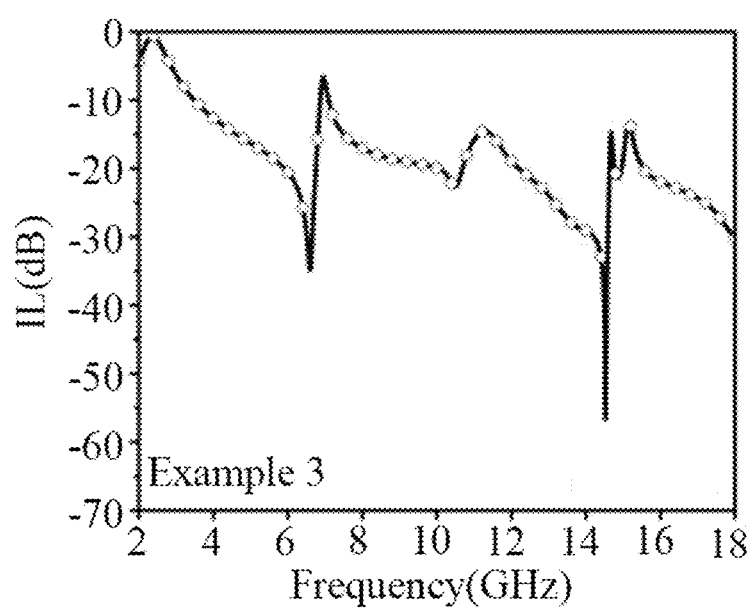

As shown in FIG. 6C, a minimum IL of the lightweight absorption-transmission integrated metamaterial provided herein is 0.65 dB, which appears at 2.37 GHz, and the corresponding transmissivity can reach over 85% or more. Moreover, the IL is equal to or less than −3 dB over a frequency range of 2.10-2.68 GHz.

Example 4

Provided herein is a lightweight absorption-transmission integrated metamaterial to EMWs with polarization stability and wide-incident-angle stability, which has a symmetric structure including 6×5 (i.e., N=6, M=5) square frequency-selective structure-units arranged periodically, that is, 30 periodically-arranged square frequency-selective structure-units shown in FIG. 1.

A side length (P) of the square frequency-selective structure-unit is 50 mm. The square frequency-selective structure-unit includes a first dielectric substrate 1, a metal array structure layer 2, a second dielectric substrate 3, a first carbon-based conductive film array structure layer 4, a third dielectric substrate 5, and a second carbon-based conductive film array structure layer 6 laminated in sequence, the first dielectric substrate 1 serves as a bottom layer, and the second carbon-based conductive film array structure layer 6 serves as a top layer (with the top being a direction of electromagnetic wave incidence).

The first dielectric substrate 1 is an FR-4 board with a size of 300 mm×250 mm×0.7 mm (thickness $H_1$), and a permittivity of 4.3.

The second dielectric substrate 3 is an FR-4 board with a size of 300 mm×250 mm×1.6 mm (thickness $H_2$), and a permittivity of 4.3.

The third dielectric substrate 5 is an FR-4 board with a size of 300 mm×250 mm×1.2 mm (thickness $H_3$), and a permittivity of 4.3.

The metal array structure layer 2 includes 30 basic-structure-units (i.e., N=6, M=5) shown in FIG. 2, each basic-structure-unit is composed of four square ring apertures 201 arranged periodically. Each square ring aperture has an outer-ring side length L of 20 mm and an inner-ring side length $L_1$ of 16 mm. The metal array structure layer 2 is made of a copper patch with an electrical conductivity of $5.8 \times 10^7$ S/m.

The first carbon-based conductive film array structure layer 4 includes 30 basic-structure-units shown in FIG. 3, and each basic-structure-unit is composed of a cross-shaped structure patch 401 located at a center. Four sides of the cross-shaped structure patch each has a length $L_2$ of 18 mm and a width $L_3$ of 4 mm. The carbon-based conductive film patch is made from carbon black and carbon nanotubes, with a sheet resistance of 80 Ω/sq.

The second carbon-based conductive film array structure layer 6 includes 30 basic-structure-units shown in FIG. 4, each basic-structure-unit is composed of four square ring patches 601 arranged periodically. Each square ring patch has an inner-ring side length $L_4$ of 9 mm and an outer-ring side length $L_5$ of 18 mm. The carbon-based conductive film patch is made from carbon black and carbon nanotubes, with a sheet resistance of 90 Ω/sq.

The center point of each of the basic-structure-unit composed of the cross-shaped structure patch 401 of the first carbon-based conductive film array structure layer 4 is configured as the horizontal symmetry center of each of the at least one square frequency-selective structure-unit. The basic-structure-unit of the metal array structure layer 2 is arranged centro-symmetrically, and its basic-structure-unit composed of the four square ring apertures is located in the four regions defined by the basic-structure-unit composed of the cross-shaped structure patch 401 of the first carbon-based conductive film array structure layer 4, respectively. The basic-structure-unit of the second carbon-based conductive film array structure layer 6 is arranged centro-symmetrically, and its basic-structure-unit composed of the four square ring patches is located in the four regions defined by the basic-structure-unit composed of the cross-shaped structure patch of the first carbon-based conductive film array structure layer 4.

The method of preparing the lightweight absorption-transmission integrated metamaterial with polarization stability and wide-incident-angle stability provided herein is different from that provided in Example 1 merely in the differences in materials and structural parameters.

Figure 5D:
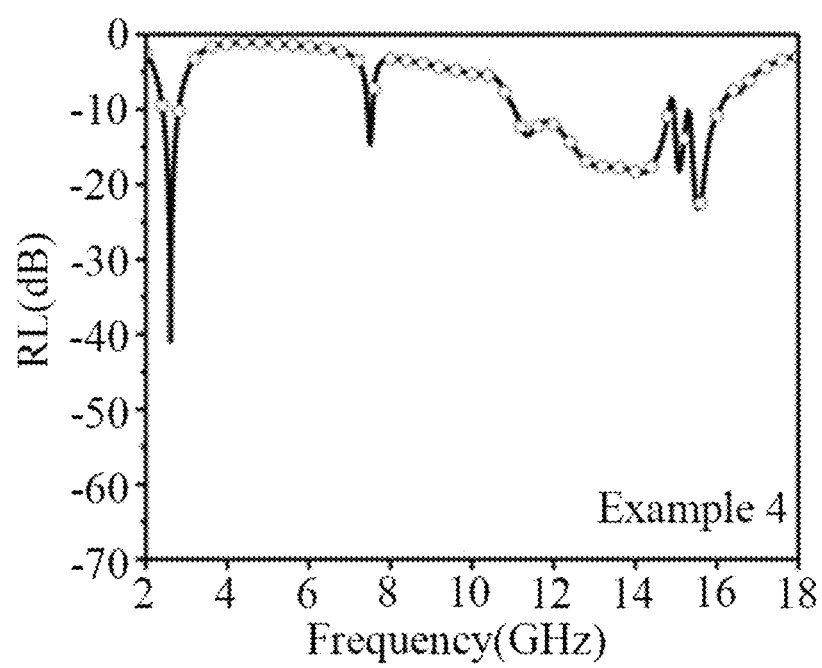

As shown in FIG. 5D, a minimum RL of the lightweight absorption-transmission integrated metamaterial provided herein appears at 15.53 GHZ, where a strong absorption of −23.17 dB is generated. Moreover, an effective absorption bandwidth (RL≤−10 dB) reaches 5.1 GHz (11-16.10 GHz).

Figure 6D:
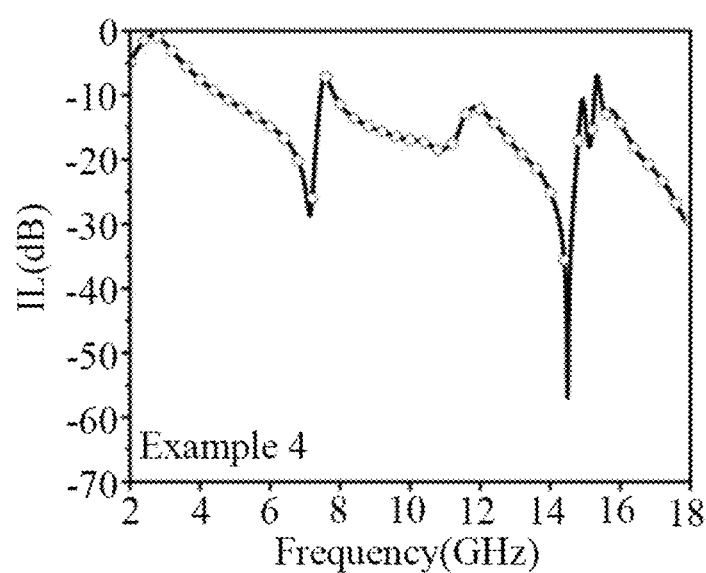
Figure 7A:
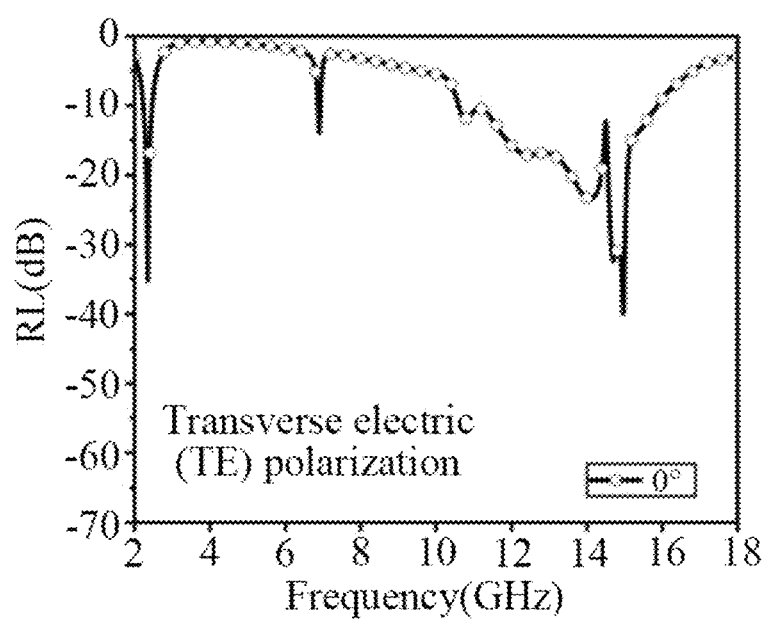
FIGS. 7A-7D show the simulation results of RL for the lightweight absorption-transmission integrated metamaterial prepared in Example 1 of the present disclosure in the case of different incidence angles of transverse electric (TE) waves, where A: 0°; B: 15°; C: 30°; and D: 45°.
Figure 7B:
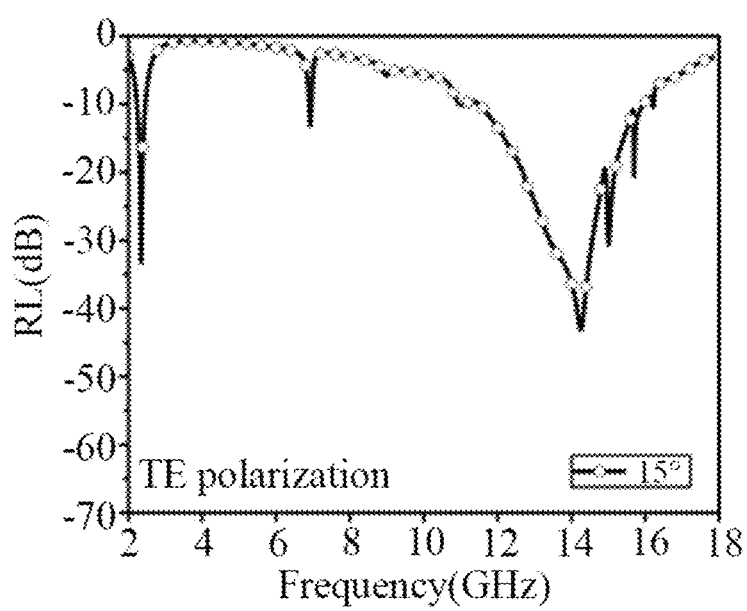
Figure 7C:
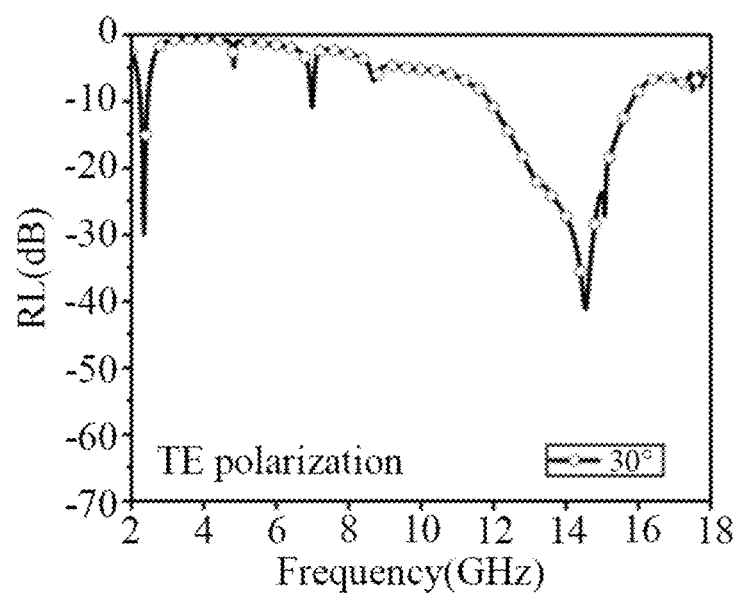
Figure 7D:
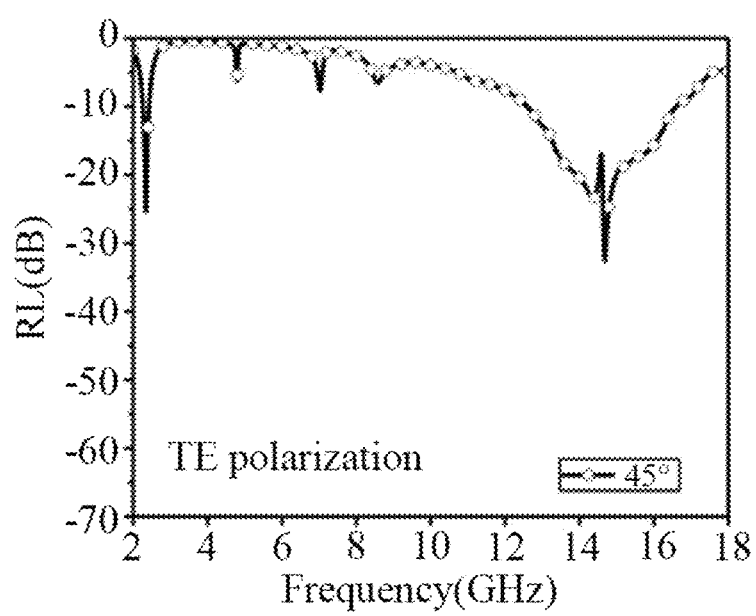
Figure 8A:
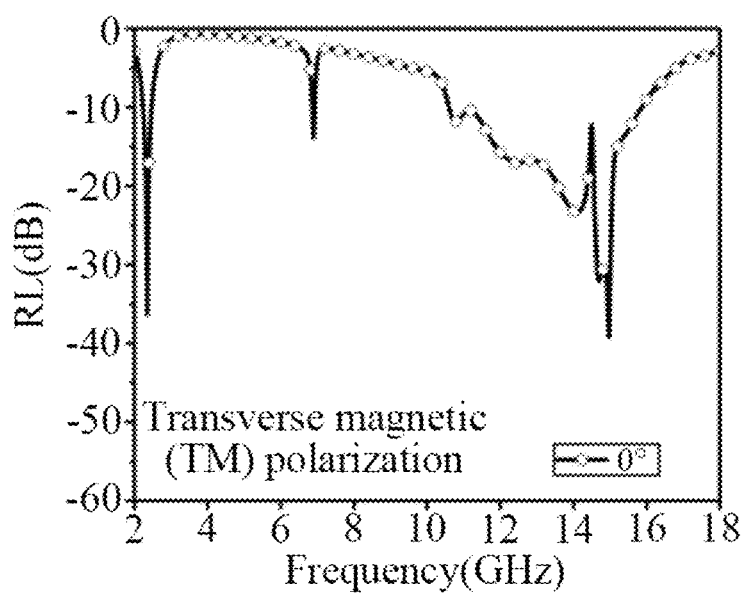
FIGS. 8A-8D show the simulation results of RL for the lightweight absorption-transmission integrated metamaterial prepared in Example 1 of the present disclosure in the case of different incidence angles of transverse magnetic (TM) waves, where A: 0°; B: 15°; C: 30°; and D: 45°.
Figure 8B:
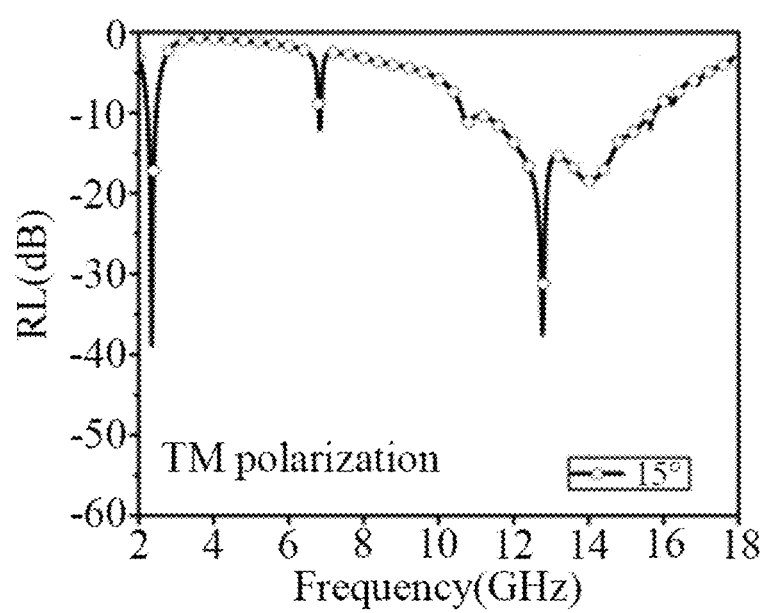
Figure 8C:
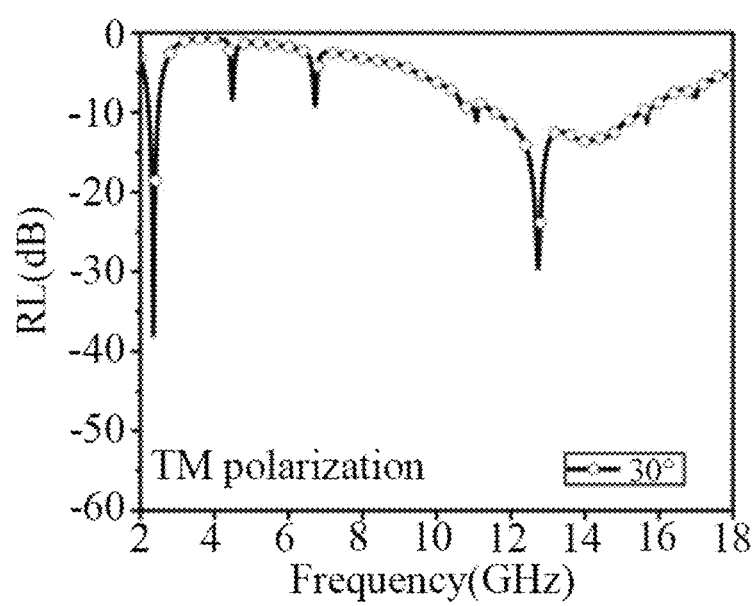
Figure 8D:
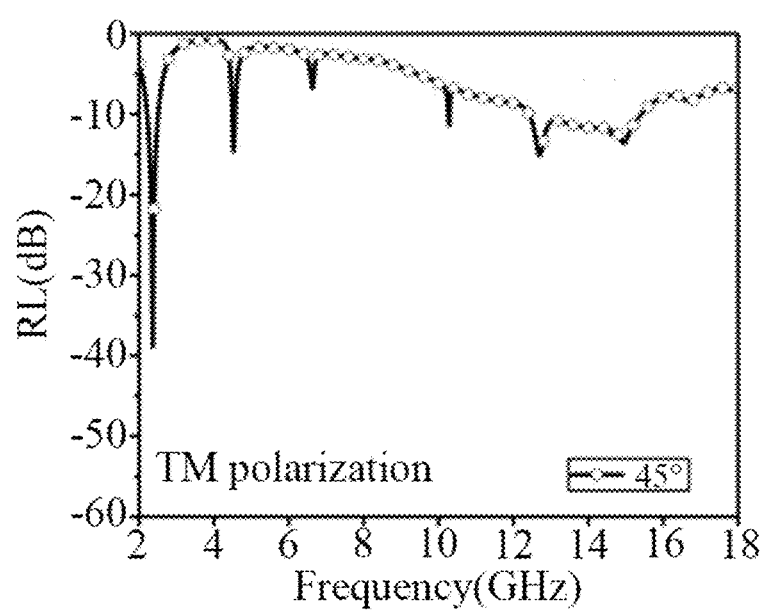
Figure 9A:
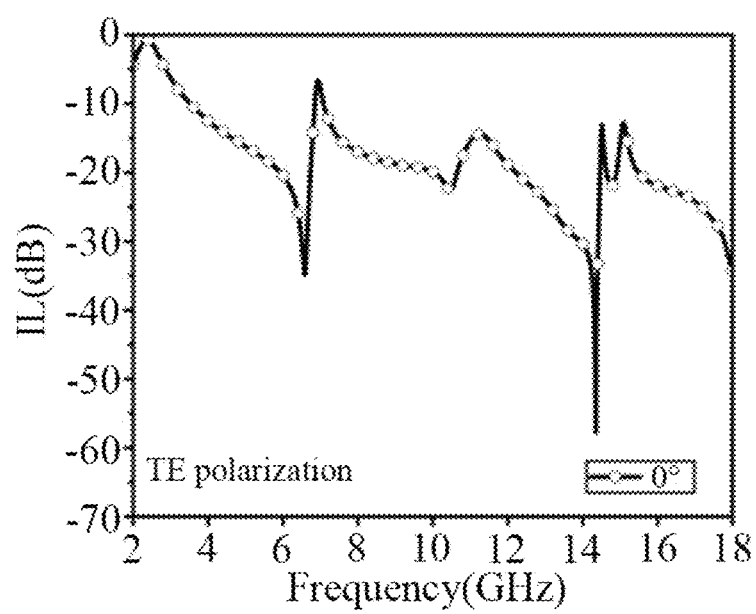
FIGS. 9A-9D show the simulation results of IL for the lightweight absorption-transmission integrated metamaterial prepared in Example 1 of the present disclosure in the case of different incidence angles of TE waves, where A: 0°; B: 15°; C: 30°; and D: 45°.
Figure 9B:
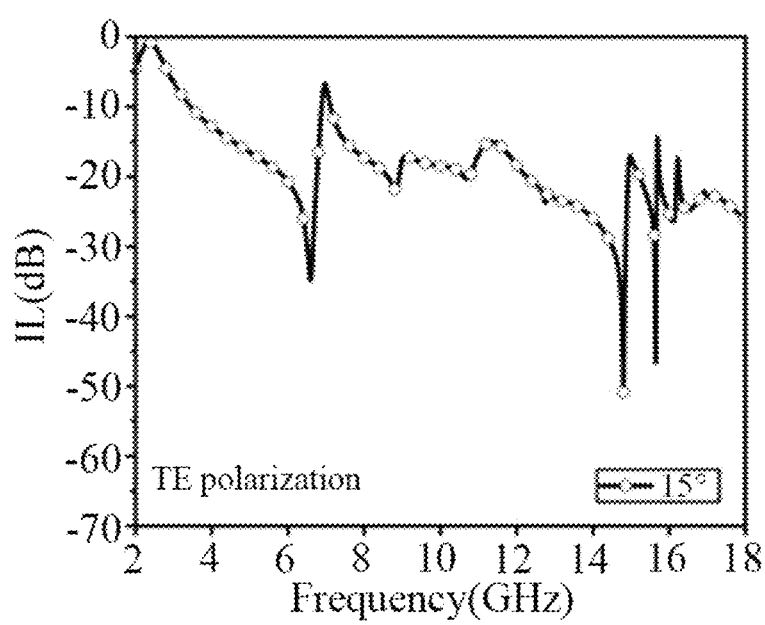
Figure 9C:
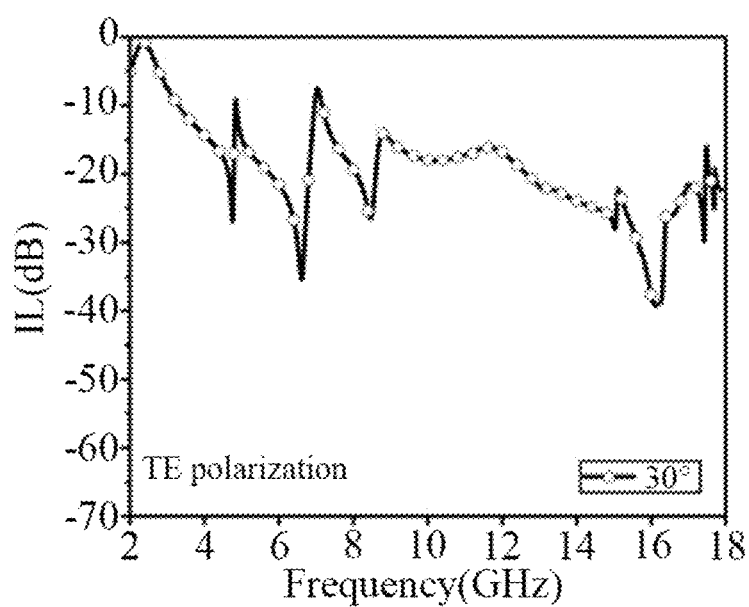
Figure 9D:
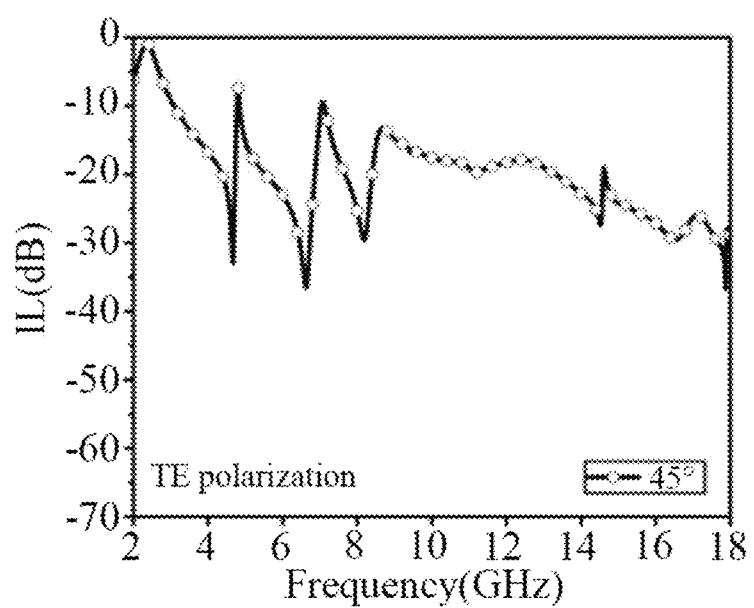
Figure 10A:
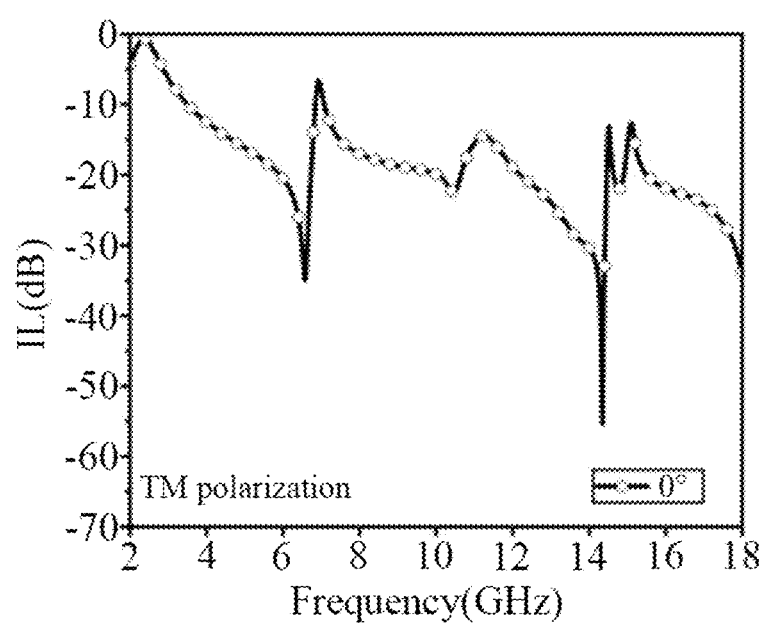
FIGS. 10A-10D show the simulation results of IL for the lightweight absorption-transmission integrated metamaterial prepared in Example 1 of the present disclosure in the case of different incidence angles of TM waves, where A: 0°; B: 15°; C: 30°; and D: 45°.
Figure 10B:
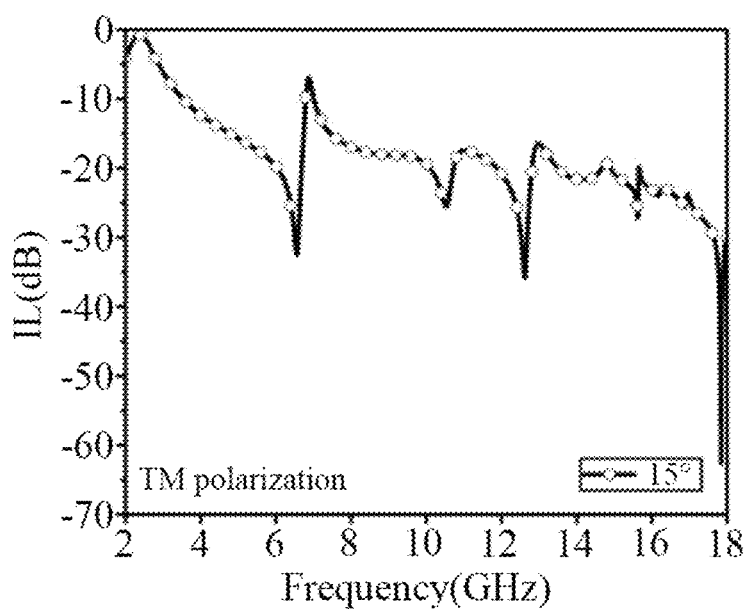
Figure 10C:
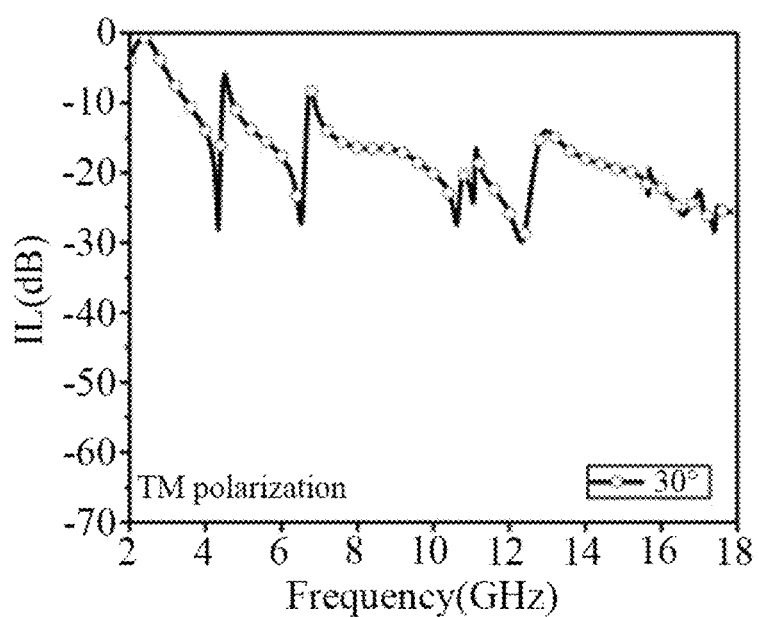
Figure 10D:
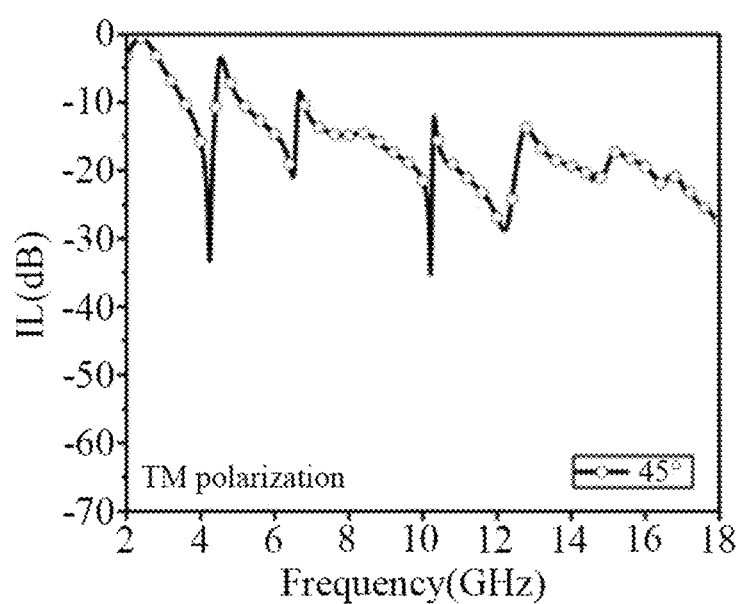

As shown in FIG. 6D, a minimum IL of the lightweight absorption-transmission integrated metamaterial provided herein is 0.66 dB, which appears at 2.37 GHz, and the corresponding transmissivity can reach over 85% or more. Moreover, the IL is equal to or less than −3 dB over a frequency range of 2.09-2.69 GHz.

Described above are merely preferred embodiments of the present disclosure, and are not intended to limit the scope of the present disclosure. It should be understood that various modifications, changes and replacements made by those skilled in the art without departing from the spirit of the disclosure shall fall within the scope of the present disclosure defined by the appended claims.

What is claimed is:

1. A lightweight absorption-transmission integrated metamaterial to electromagnetic waves with polarization stability and wide-incident-angle stability, wherein the lightweight absorption-transmission integrated metamaterial is a symmetrical structure comprising at least one square frequency-selective structure-unit arranged periodically;

a side length of each of the at least one square frequency-selective structure-unit is 50 mm; each of the at least one square frequency-selective structure-unit comprises a first dielectric substrate, a metal array structure layer, a second dielectric substrate, a first carbon-based conductive film array structure layer, a third dielectric substrate, and a second carbon-based conductive film array structure layer laminated in sequence, the first dielectric substrate serves as a bottom layer, and the second carbon-based conductive film array structure layer serves as a top layer;

the metal array structure layer is configured as a frequency-selective-transmission layer, and is made of a metal patch;

the first carbon-based conductive film array structure layer and the second carbon-based conductive film array structure layer are each configured as a frequency-selective-absorption layer, and are both made of a carbon-based conductive film patch;

the metal array structure layer is formed by a basic-structure-unit composed of four square ring apertures arranged periodically;

the first carbon-based conductive film array structure layer comprises a basic-structure-unit composed of a cross-shaped structure patch; and the second carbon-based conductive film array structure layer comprises a basic-structure-unit composed of four square ring patches arranged periodically.

2. The lightweight absorption-transmission integrated metamaterial of claim 1, wherein a center point of the basic-structure-unit composed of the cross-shaped structure patch of the first carbon-based conductive film array structure layer is configured as a horizontal symmetry center of each of the at least one square frequency-selective structure-unit;

the basic-structure-unit of the metal array structure layer is arranged centro-symmetrically, and the four square ring apertures of the basic-structure-unit of the metal array structure layer are located in four regions defined by the cross-shaped structure patch of the basic-structure-unit of the first carbon-based conductive film array structure layer, respectively; and the basic-structure-unit of the second carbon-based conductive film array structure layer is arranged centro-symmetrically, and the four square ring patches of the basic-structure-unit of the second carbon-based conductive film array structure layer are located in the four regions defined by the cross-shaped structure patch of the first carbon-based conductive film array structure layer.

3. The lightweight absorption-transmission integrated metamaterial of claim 1, wherein the four square ring apertures of the metal array structure layer is made of a copper patch with an electrical conductivity of $5.8 \times 10^7$ S/m;

a sheet resistance of the carbon-based conductive film patch of the first carbon-based conductive film array structure layer is 50-110 $\Omega$/sq; and a sheet resistance of the carbon-based conductive film patch of the second carbon-based conductive film array structure layer is 90-130 $\Omega$/sq.

4. The lightweight absorption-transmission integrated metamaterial of claim 1, wherein the first dielectric substrate, the second dielectric substrate, and the third dielectric substrate are each made of an epoxy resin-reinforced glass fiber composite board with a permittivity of 4.3.

5. The lightweight absorption-transmission integrated metamaterial of claim 1, wherein a thickness $H_1$ of the first dielectric substrate is 0.5-0.7 mm; a thickness $H_2$ of the second dielectric substrate is 1.5-1.8 mm; and a thickness $H_3$ of the third dielectric substrate is 0.9-1.3 mm.

6. The lightweight absorption-transmission integrated metamaterial of claim 1, wherein in the basic-structure-unit of the metal array structure layer, each of the four square ring apertures has an outer-ring side length L of 19-21 mm and an inner-ring side length $L_1$ of 16-18 mm;

in the basic-structure-unit of the first carbon-based conductive film array structure layer, four sides of the cross-shaped structure patch each has a length $L_2$ of 14-18 mm and a width $L_3$ of 2-4 mm; and in the basic-structure-unit of the second carbon-based conductive film array structure layer, each of the four square ring patches has an inner-ring side length $L_4$ of 7-10 mm and an outer-ring side length $L_5$ of 15-18 mm.

* * * * *